(12) United States Patent
Ngo et al.

(10) Patent No.: US 6,660,634 B1
(45) Date of Patent: Dec. 9, 2003

(54) METHOD OF FORMING RELIABLE CAPPED COPPER INTERCONNECTS

(75) Inventors: Minh Van Ngo, Union City, CA (US); Shekhar Pramanick, Fremont, CA (US); Takeshi Nogami, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/291,612

(22) Filed: Nov. 12, 2002

Related U.S. Application Data

(63) Continuation of application No. 09/112,158, filed on Jul. 9, 1998, now Pat. No. 6,303,505.

(51) Int. Cl.[7] ............................................... H01L 21/44
(52) U.S. Cl. ...................... 438/687; 438/627; 438/628; 438/629; 438/630; 438/633; 438/643; 438/644; 438/645; 438/651; 438/675; 438/678; 438/902; 438/906
(58) Field of Search ............................... 438/627, 628, 438/629, 630, 633, 643, 644, 645, 651, 675, 678, 687, 902, 906, FOR 390, FOR 448

(56) References Cited

U.S. PATENT DOCUMENTS

| | | | |
|---|---|---|---|
| 4,789,648 A | 12/1988 | Chow et al. | 438/633 |
| 5,447,887 A | * 9/1995 | Filipiak et al. | 438/644 |
| 5,510,295 A | 4/1996 | Cabral, Jr. et al. | 437/200 |
| 5,900,672 A | 5/1999 | Chan et al. | 257/751 |
| 5,913,147 A | 6/1999 | Dubin et al. | 438/687 |
| 6,001,730 A | 12/1999 | Farkas et al. | 438/627 |
| 6,174,810 B1 | * 1/2001 | Islam et al. | 438/687 |

FOREIGN PATENT DOCUMENTS

WO    WO 93/17453    9/1993

OTHER PUBLICATIONS

"Passivation of copper by silicide formation in dilute silane" S. Hymes et al, J. Appl. Phys. 71 (9), May 1, 1992, pp. 4623–4625.
VLSI Fabrication Principles, 2nd Edit., Sorab Ghandi, John Wiley & Sons, Inc., 1994, p. 641.
"Silicon Processing for the VLSI Era", vol. 1, Wolf et al, Lattice Press, 1986, pp. 386, 387.

* cited by examiner

*Primary Examiner*—George Fourson
*Assistant Examiner*—Julio J. Maldonado

(57) ABSTRACT

The adhesion of a diffusion barrier or capping layer to a Cu or Cu alloy interconnect member is significantly enhanced by treating the exposed surface of the Cu or Cu alloy interconnect member: (a) under plasma conditions with ammonia and silane or dichlorosilane to form a copper silicide layer thereon; or (b) with an ammonia plasma followed by reaction with silane or dichlorosilane to form a copper silicide layer thereon. The diffusion barrier layer is then deposited on the copper silicide layer. Embodiments include electroplating or electroless plating Cu or a Cu alloy to fill a damascene opening in a dielectric interlayer, chemical mechanical polishing, then treating the exposed surface of the Cu/Cu alloy interconnect to form the copper silicide layer thereon, and depositing a silicon nitride diffusion barrier layer on the copper silicide layer.

15 Claims, 2 Drawing Sheets

METHOD OF FORMING RELIABLE CAPPED COPPER INTERCONNECTS

RELATED APPLICATIONS

This application is a continuation of U.S. patent application Ser. No. 09/112,158, filed Jul. 9, 1998, which contains subject matter related to subject matter disclosed in copending U.S. application Ser. No. 09/112/472 filed on Jul. 9, 1998, now U.S. Pat. No. 6,303,505 and related to subject matter disclosed in U.S. patent application Ser. No. 09/112,161 filed on Jul. 9, 1998, now U.S. Pat. No. 6,211,084.

TECHNICAL FIELD

The present invention relates to copper (Cu) and/or Cu alloy metallization in semiconductor devices. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology, which is considered one of the most demanding aspects of ultra large scale integration technology. Such escalating requirements have been found difficult to satisfy in terms of providing a low RC (resistance capacitance) interconnect pattern, particularly wherein submicron vias, contacts and trenches have high aspect ratios imposed by miniaturization.

Conventional semiconductor devices comprise a semiconductor substrate, typically doped monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers are electrically connected by a conductive plug filling a via hole, while a conductive plug filling a contact hole establishes electrical contact with an active region on a semiconductor substrate, such as a source/drain region. Conductive lines formed in trench openings typically extend substantially horizontal with respect to the semiconductor substrate. Semiconductor "chips" comprising five or more levels of metallization are becoming more prevalent as device geometries shrink to submicron levels.

A conductive plug filling a via hole is typically formed by depositing a dielectric interlayer on a conductive layer comprising at least one conductive pattern, forming an opening through the dielectric interlayer by conventional photolithographic and etching techniques, and filling the opening with a conductive material, such as tungsten (W). Excess conductive material on the surface of the dielectric interlayer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Thus, the interconnection pattern limits the speed of the integrated circuit.

If the interconnection node is routed over a considerable distance, e.g., hundreds of microns or more as in submicron technologies, the interconnection capacitance limits the circuit node capacitance loading and, hence, the circuit speed. As integration density increases and feature size decreases in accordance with submicron design rules, the rejection rate due to integrated circuit speed delays approaches and even exceeds 20%.

One way to increase the control speed of semiconductor circuitry is to reduce the resistance of a conductive pattern. Conventional metallization patterns are typically formed by depositing a layer of conductive material, notably aluminum (Al) or an alloy thereof, and etching, or by damascene techniques. Excess conductive material on the surface of the dielectric layer is then removed as by CMP. Al is conventionally employed because it is relatively inexpensive, exhibits low resistivity and is relatively easy to etch. However, as the size of openings for vias/contacts and trenches is scaled down to the sub-micron range step coverage problems have arisen involving the use of Al which has decreased the reliability of interconnections formed between different wiring layers. Such poor step coverage results in high current density and enhanced electromigration. Moreover, low dielectric constant polyamide materials when employed as dielectric interlayers, create moisture/bias reliability problems when in contact with Al.

One approach to improved interconnection paths in vias comprises the use of completely filled plugs of a metal, such as W. Accordingly, many current semiconductor devices utilizing VLSI (very large scale integration) technology employ Al for a wiring metal and W plugs for interconnections at different levels. However, the use W is attendant with several disadvantages. For example, most W processes are complex and expensive. Moreover, W has a high resistivity. The Joule heating may enhance electromigration of adjacent Al wiring. Furthermore. W plugs are susceptible to void formation and the interface with the wiring layer usually results in high contact resistance.

Another attempted solution for the Al plug interconnect problem comprises the use of chemical vapor deposition (CVD) or physical vapor deposition (PVD) at elevated temperatures for Al deposition. The use of CVD for depositing Al has proven expensive, while hot PVD Al deposition requires very high process temperatures incompatible with manufacturing integrated circuitry.

Cu and Cu alloys have received considerable attention as a candidate for replacing Al in VLSI interconnect metallizations. Cu exhibits superior electromigration properties and has a lower resistivity than Al. In addition, Cu has improved electrical properties vis-à-vis W, making Cu a desirable metal for use as a conductive plug as well as conductive wiring.

Electroless plating and electroplating of Cu and Cu alloys offer the prospect of low cost, high throughput, high quality plated films and efficient via, contact and trench filling capabilities. Electroless plating generally involves the controlled autocatalytic deposition of a continuous film on the catalytic surface by the interaction in solution of a metal salt and a chemical reducing agent. Electroplating comprises the electrodeposition of an adherent metallic coating on an electrode employing externally supplied electrons to reduce metal ions in the plating solution. A seed layer is required to catalyze electroless deposition or to carry electrical current for electroplating. For electroplating, the seed layer must be continuous. For electroless plating, very thin catalytic layers, e.g., less than 100 Å, can be employed in the form of islets of catalytic metal.

There are disadvantages attendant upon the use of Cu or Cu alloys. For example, Cu readily diffuses through silicon dioxide, the typical dielectric interlayer material employed in the manufacture of semiconductor devices, into silicon elements and adversely affects device performance.

One approach to forming Cu plugs and wiring comprises the use of damascene structures employing CMP, as in Chow et al., U.S. Pat. No. 4,789,648. However, due to Cu diffusion through dielectric interlayer materials, such as silicon dioxide, Cu interconnect structures must be encapsulated by a diffusion barrier layer. Typical diffusion barrier metals include tantalum (Ta), tantalum nitride (TaN), titanium nitride (TIN), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are, however, significant problems attendant upon conventional Cu interconnect methodology employing a diffusion barrier layer. For example, conventional practices comprise forming a damascene opening in a dielectric interlayer, depositing a barrier layer such as TaN, filling the opening with Cu or a Cu alloy layer, CMP, and forming a capping layer on the exposed surface of the Cu or Cu alloy. It was found, however, that capping layers, such as silicon nitride, exhibit poor adhesion to the Cu or Cu alloy surface. Consequently, the capping layer is vulnerable to removal, as by peeling due to scratching or stresses resulting from subsequent deposition of layers. As a result, the Cu or Cu alloy is not entirely encapsulated and Cu diffusion occurs thereby adversely affecting device performance and decreasing the electromigration resistance of the Cu or Cu alloy interconnect member.

In U.S. Pat. No. 5,447,887, the adhesion problem of a silicon nitride capping layer to a copper interconnect is addressed by initially treating the exposed surface with silane in the absence of a plasma to form a thin layer of copper silicide, and depositing a silicon nitride capping layer thereon. The use of silane to passivate Cu by silicide formation is also disclosed by Hymes et al., "Passivation of copper by silicide formation in dilute silane", J. Appl. Phys. 71 (9) May 1, 1992, pp. 4623–4625.

As design rules extend deeper into the submicron range, e.g., about 0.18 microns and under, the reliability of the interconnect pattern becomes particularly critical. Accordingly, the adhesion of capping layers to Cu interconnects requires even greater reliability.

There exists a need for methodology enabling the formation of encapsulated Cu and Cu alloy interconnect members having high reliability. There exists a particular need for improving the adhesion of capping layers to Cu and Cu alloy interconnect members.

DISCLOSURE OF THE INVENTION

An advantage of the present invention is a method of manufacturing a semiconductor device having highly reliable Cu or Cu alloy interconnect members.

Another advantage of the present invention is a method of manufacturing a semiconductor device comprising a Cu or Cu alloy interconnect member having a silicon nitride capping layer tightly adhered thereto.

Additional advantages and other features of the present invention will be set forth in the description which follows, and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a copper (Cu) or Cu alloy layer; and forming a layer of copper silicide on a surface of the Cu or Cu alloy layer by: (a) treating the surface of the Cu or Cu alloy layer with an ammonia plasma followed by reacting the treating surface with silane or dichlorosilane to form the copper silicide layer, or (b) treating the surface of the Cu or Cu alloy layer under plasma conditions with ammonia and silane or dichlorosilane to form the copper silicide layer.

Another aspect of the present invention is a method of manufacturing a semiconductor device, the method comprising: forming an opening in a dielectric layer, depositing Cu or a Cu alloy layer in the opening and over the dielectric layer; removing any portion of the Cu or Cu alloy layer beyond the opening by chemical mechanical polishing, leaving an exposed surface oxidized; forming a layer of copper suicide on the exposed surface of the Cu or Cu alloy layer by: (a) treating the exposed surface of the Cu or Cu alloy layer with an ammonia plasma followed by reacting the treated surface with silane or dichlorosilane to form the copper silicide layer: or (b) treating the exposed surface of the Cu or Cu alloy layer under plasma conditions with ammonia and silane or dichlorosilane to form the copper silicide layer; and depositing a silicon nitride diffusion barrier layer on the copper silicide layer.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
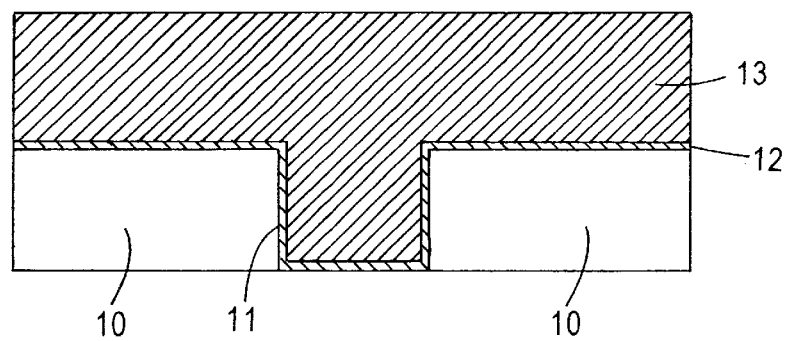
FIGS. 1–5 illustrate sequential phases of a method in accordance with an embodiment of the present invention.

The present invention addresses and solves problems attendant upon capping a Cu or Cu alloy interconnect, as with a capping layer of silicon nitride. Specifically, the present invention enables increased adhesion of a capping layer, such as silicon nitride, to a Cu or Cu alloy interconnect member, thereby preventing capping layer peeling, preventing copper diffusion and enhancing electromigration resistance.

As design rules are scaled down into the deep submicron range, e.g., about 0.18 microns and under, the reliability of encapsulated Cu and/or Cu alloy interconnect members becomes increasingly significant. It was found that conventional practices in forming a Cu and/or Cu alloy interconnect member in a damascene opening results in the formation of a thin copper oxide surface film, believed to comprise a mixture of CuO and $Cu_2O$. It is believed that such a thin copper oxide surface layer forms during CMP. The thin copper oxide surface film layer is porous and brittle in nature. The presence of such a thin copper oxide surface film undesirably reduces the adhesion of a capping layer, such as silicon nitride to the underlying Cu and/or Cu alloy interconnect member. Consequently, cracks are generated at the Cu or Cu alloy/copper oxide interface, thereby resulting in copper diffusion and increased electromigration as a result of such diffusion. The cracks occurring in the Cu or Cu alloy/copper oxide interface enhance surface diffusion, which is more rapid than grain boundary diffusion or lattice diffusion. The silane treatment disclosed in U.S. Pat. No. 5,447,887, issued to Filipiak et al., generates a thin copper silicide layer on the underlying Cu interconnect member which improves adhesion of a silicon nitride capping layer thereto, but does not address or solve the diminution in adhesion attributable to the presence of the thin copper oxide surface film, which adversely affects adhesion of the capping layer thereon.

The present invention constitutes an improvement over conventional practices in forming a copper silicide layer on a Cu and/or Cu alloy interconnect member prior to depositing a capping layer, such as silicon nitride, thereon. The present invention enables the formation of a thin, reliable, uniform and tightly bonded layer of copper suicide on an exposed surface of a Cu or Cu alloy interconnect member, notwithstanding the undesirable thin copper oxide surface film formed during CMP, thereby enhancing adhesion of the subsequently deposited diffusion barrier layer, such as silicon nitride. In accordance with embodiments of the present invention, the layer of copper silicide can be formed by: (a) an ammonia plasma treatment followed by reaction, as with silane or dichlorosilane to form the copper silicide layer, or (b) treatment with ammonia and silane or dichlorosilane under plasma conditions to form the copper silicide layer.

In accordance with an embodiment of the present invention, the exposed surface of the Cu and/or Cu alloy layer is treated with an ammonia-containing plasma prior to forming the copper silicide layer thereon. Treatment with an ammonia-containing plasma effectively cleans the exposed surface of the Cu or Cu alloy interconnect member, as by substantially reducing or removing the thin copper oxide film from the surface thereof, thereby presenting a clean Cu or Cu alloy surface for reaction, as with silane or dichlorosilane, to form a tightly adhered thin copper silicide layer which enhances adhesion of the subsequentially formed capping layer thereon, such as silicon nitride.

Cu and/or Cu alloy interconnect members formed in accordance with embodiments of the present invention can be, but are not limited to, interconnects formed by damascene technology. Thus, embodiments of the present invention include forming a dielectric interlayer overlying a substrate, forming an opening, e.g., a damascene opening, in the dielectric interlayer, depositing a diffusion barrier layer, such as TaN, and filling the opening with Cu or a Cu alloy layer. Advantageously, the opening in the dielectric interlayer can be filled by initially depositing a seed layer and then electroplating or electroless plating the Cu or Cu alloy layer. CMP is then performed such that the upper surface of the Cu or Cu alloy layer is substantially coplanar with the upper surface of the dielectric interlayer. As a result of CMP, a thin film of copper oxide is typically formed. In accordance with embodiments of the present invention, the exposed oxidized surface of the Cu or Cu alloy is treated with an ammonia-containing plasma to remove or substantially reduce the thin copper oxide film, thereby presenting a clean surface for reaction, as with silane or dichlorosilane, to form a thin layer of copper silicide. A capping layer, such as silicon nitride, is then deposited in accordance with conventional methodology.

In accordance with other embodiments of the present invention, the formation of a thin copper silicide layer on a Cu or Cu alloy interconnect member, prior to deposition of a diffusion barrier or capping layer thereon, such as silicon nitride, is significantly enhanced by treating the exposed surface of the Cu or Cu alloy interconnect member with both with ammonia and silane or dichlorosilane under plasma conditions, such that the oxidized copper surface is reduced and silicon from the silane or dichlorosilane reacts with the underlying reduced copper to form the copper silicide layer which, in turn, significantly improves adhesion of the subsequently deposited capping layer. It was found that the inclusion of silane or dichlorosilane during plasma treatment with ammonia enhances formation of the copper silicide layer vis-à-vis, subsequent treatment with silane or dichlorosilane in the absence of a plasma.

The exact mechanism involved in enhancing copper silicide formation by virtue of employing plasma conditions during silane or dichlorosilane treatment is not known with certainty. However, it is believed that the use of plasma conditions during silane or dichlorosilane treatment increases the efficiency of silicon bond breaking and further enables penetration of silicon atoms into the underlying Cu or Cu alloy layer. For example, it is believed that the generation of a plasma, as by imposing an RF of about 300 to about 700 watts, significantly enhances silicon bond breaking in silane or dichlorosilane and increases silicon ion bombardment, thereby facilitating silicon atom penetration into the underlying Cu or Cu alloy layer. The present invention enables the formation of a tightly adherent, uniform copper silicide layer having a thickness of about 10 Å to about 1,000 Å, e.g. about 10 Å to about 100 Å.

Given the present disclosure and the objectives of the present invention, the conditions during plasma treatment with ammonia or plasma treatment with ammonia and silane or dichlorosilane can be optimized in a particular situation. For example, it was found suitable to treat the exposed surface of the Cu or Cu alloy layer with an ammonia plasma at an ammonia flow rate of about 500 to about 3,000 sccm, a pressure of about 1.9 to about 2.5 Torr., a temperature of about 250° C. to about 350° C., and a RF power of about 300 to about 700 watts, for about 1 second to about 20 seconds. Embodiments of the present invention also include, subsequent to treatment with an ammonia-containing plasma, reacting the cleaned surface of the Cu or Cu alloy interconnect member with silane or dichlorosilane at a silane or dichlorosilane flow rate of about 100 to about 500 sccm, a nitrogen flow rate of about 500 to about 2000 sccm, a pressure of about 2.1 to about 2.6 Torr, and a temperature of about 250° C. to about 350° C. to form a thin layer of copper silicide on the Cu or Cu alloy interconnect. Such a copper silicide layer typically has a thickness of about 10 Å to about 1000 Å, e.g., about 10 Å to about 100 Å. In the embodiment wherein the exposed Cu or Cu alloy layer is treated under plasma conditions with both ammonia and silane or dichlorosilane, the same conditions are employed, including a silane or dichlorosilane flow rate is about 100 to about 500 sccm. Advantageously, treatment of the interconnect in an ammonia-containing plasma, reaction with silane or dichlorosilane to form the thin copper silicide layer and deposition of the capping layer, e.g., silicon nitride, are conducted in the same CVD apparatus or tool. Alternatively, treatment with ammonia and silane or dichlorosilane under plasma conditions and deposition of the capping layer are conducted in the same tool.

In accordance with the embodiments of the present invention, the damascene opening can also be filled by Cu or a Cu alloy by PVD at a temperature of about 50° C. to about 150° C. or by CVD at a temperature under about 200° C. Embodiments of the present invention also include annealing, subsequent to formation of the capping layer, to enhance reaction of copper with silicon to form $Cu_xSi_y$, wherein y=1 and x=3–5. Such annealing can advantageously be conducted at a temperature of about 350° C. to about 400° C.

In the various embodiments of the present invention, conventional substrates and dielectric interlayers, barrier layers and capping layers can be employed. For example, the substrate can be doped monocrystalline silicon or gallium-arsenide. The dielectric interlayer employed in the present invention can comprise any dielectric material conventionally employed in the manufacture of semiconductor devices. For example, dielectric materials such as silicon dioxide, phospho-silicate-glass (PSG), boron doped PSG (BPSG), and silicon dioxide derived from tetraethylorthosilicate (TEOS) or silane by PECVD can be employed. The openings formed in dielectric layers are effected by conventional photolithographic and etching techniques. Dielectric interlayers in accordance with the present invention can also comprise low dielectric constant materials, including polymers, such as polyimides. The conditions under which a capping layer, such as silicon nitride, is formed are conventional and, hence, not elaborated upon herein.

An embodiment of the present invention is schematically illustrated in FIGS. 1–5, wherein similar reference numerals denote similar features. Adverting to FIG. 1, damascene opening 11, such as a contact or via hole, is formed in dielectric layer 10. e.g., silicon dioxide. It should be understood that opening 11 can also be formed as a dual damascene opening comprising a contact or via hole in communication with a trench opening. A barrier layer 12 is deposited, such as TaN. Cu or a Cu alloy layer 13 is then deposited. Upon electroplating or electroless plating layer 13, a seed layer (not shown) is deposited on barrier layer 12.

Figure 2:
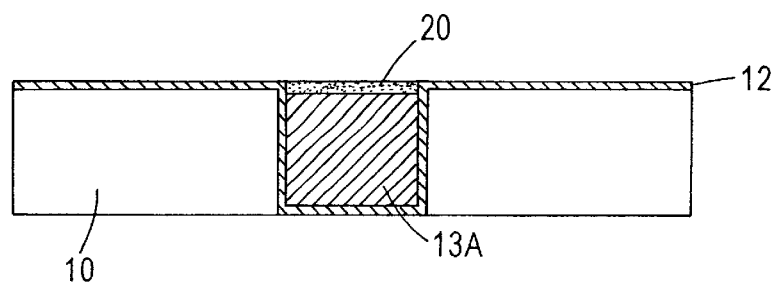

Adverting to FIG. 2, the portions of the Cu or Cu alloy layer 13 extending beyond opening 11 are removed, as by CMP. As a result, a thin film of copper oxide 20 is formed on the exposed surface of the Cu or Cu alloy interconnect member 13A.

Figure 3:
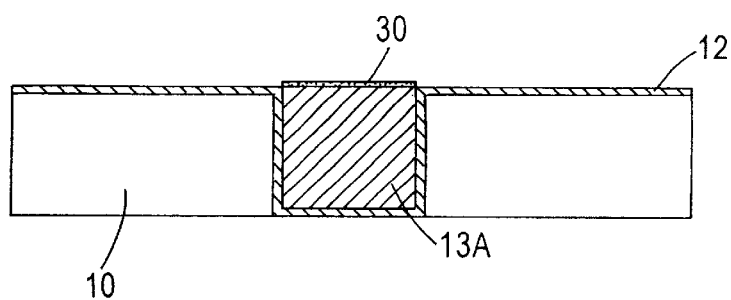

Adverting to FIG. 3, in accordance with embodiments of the present invention, the exposed surface of the Cu or Cu alloy interconnect member 13A having a thin copper oxide film 20 thereon is treated with an ammonia-containing plasma to remove or substantially reduce the thin copper oxide film 20 leaving a clean reduced Cu or Cu alloy surface 30.

Figure 4:
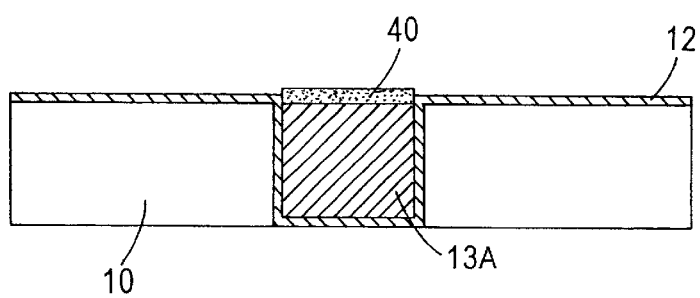

As shown in FIG. 4, a copper silicide layer 40 is then formed on the cleaned exposed surface 30 of Cu or Cu alloy interconnect 13, as by reaction with silane or dichlorosilane. The methodology disclosed in U.S. Pat. No. 5,447,887 can be employed to implement formation of copper silicide layer 40.

Figure 5:
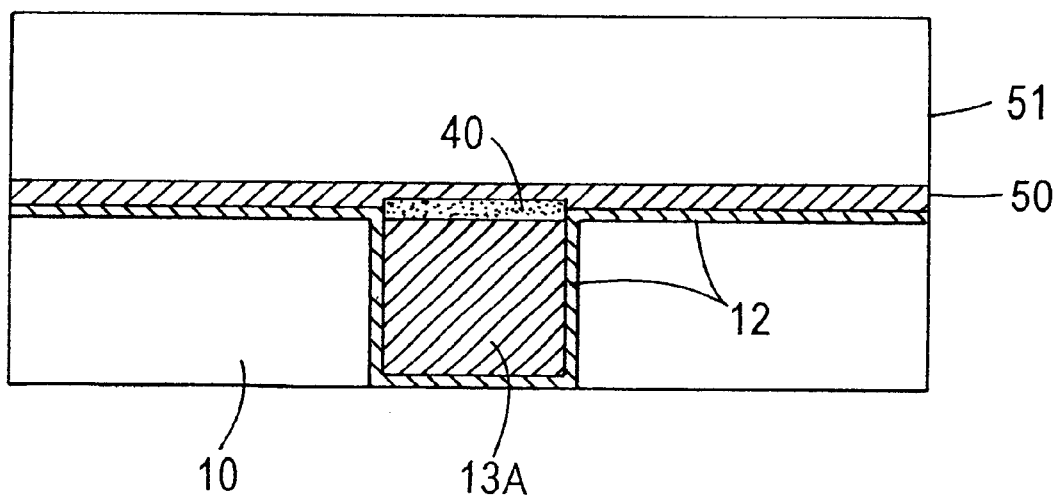

As shown in FIG. 5, a capping layer 50, such as silicon nitride, is then formed in a conventional manner completely encapsulating the Cu or Cu alloy interconnect 13A. Another dielectric layer or interlayer 51 is then deposited, such as silicon dioxide derived from TEOS or silane. In this way, a plurality of dielectric interlayers and metallization patterns are built up on a semiconductor substrate and various interconnects are formed.

Embodiments of the present invention comprising treating the exposed oxidized surface 20 (FIG. 2) with both ammonia and silane or dichlorosilane under plasma conditions result in the substantial simultaneous reduction of surface oxide layer 20 and enhanced penetration of silicon atoms into the underlying Cu or Cu alloy interconnected member to form copper silicide layer 40 (FIG. 4). In such embodiments, the resulting copper silicide layer exhibits even greater uniformity and is even more tightly bonded to the underlying Cu or Cu alloy interconnect member.

In accordance with embodiments of the present invention, a thin, high integrity, uniform, tightly adhering copper silicide film is form on an exposed surface of a Cu and/or Cu alloy interconnect member, thereby significantly improving adhesion of a subsequently deposited capping layer, such as silicon nitride thereon, typically deposited at a thickness of about 100 Å to about 500 Å. The present invention enables the formation of extremely reliable Cu and/or Cu alloy interconnect members by enhancing the integrity, uniformity, and adhesion of a copper silicide layer on the Cu or Cu alloy interconnect member, thereby enhancing the adhesion of a capping layer, such as silicon nitride, thereon. Consequently, the present invention advantageously reduces capping layer peeling, reduces copper diffusion and enhances electromigration resistance. The removal or substantial reduction of a thin copper oxide film from the surface of the Cu and/or Cu alloy interconnect member prior to copper silicide formation, in accordance with the present invention, significantly improves the reliability of the Cu and/or Cu alloy interconnect member with an attendant improvement in device reliability and performance. Exposure of the oxidized surface of the Cu and/or Cu alloy interconnect member to both ammonia and silane or dichlorosilane under plasma conditions further increases the uniformity and adhesion of the copper silicide film and, hence, enhances adhesion of the capping layer with an even greater reduction in copper diffusion and increase in electromigration resistance.

The present invention is applicable to the formation of various types of inlaid Cu and Cu alloy metallization interconnection patterns. The present invention is particularly applicable in manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, the method comprising:

forming a copper (Cu) or a Cu alloy layer; and forming a layer of copper silicide on a surface of the Cu or Cu alloy layer by treating the surface of the Cu or Cu alloy layer with an ammonia plasma followed by reacting the treated surface with silane or dichlorosilane to form the copper silicide layer.

2. The method according to claim 1, further comprising forming a diffusion barrier layer on the copper suicide layer.

3. The method according to claim 2, comprising forming the diffusion barrier by depositing a layer comprising silicon nitride.

4. The method according to claim 1, comprising forming the layer of copper suicide at a thickness of about 10 Å to abut 1,000 Å.

5. The method according to claim 2, comprising forming the layer of copper silicide at a thickness of about 10 Å to about 1,000 Å.

6. The method according to claim 1, comprising forming the Cu or Cu alloy layer by:

depositing a seed layer; and electroplating or electroless plating the Cu or Cu alloy on the seed layer.

7. The method according to claim 1, comprising forming the copper silicide layer by treating the surface of the Cu or Cu alloy layer with the ammonia plasma at:

an ammonia flow rate of abut 500 to about 3,000 sccm;

a pressure of about 1.9 to about 2.5 Torr;

a temperature of about 250° C. to about 350° C. and;

a RF power of about 300 to about 700 watts.

8. The method according to claim 7, comprising treating the surface of the Cu or Cu alloy layer with the ammonia plasma for about 1 second to about 20 seconds.

9. The method according to claim 3, further comprising annealing at a temperature of about 350° C. to about 400° C.

10. The method according to claim 3, comprising treating the surface of the Cu or Cu alloy layer to form the copper silicide layer and forming the silicon nitride diffusion barrier layer in the same tool.

11. The method according to claim 1, comprising:

forming a dielectric layer overlying a substrate;

forming an opening in the dielectric layer;

depositing the Cu or Cu alloy layer in the opening and over the dielectric layer;

removing any portion of the Cu or Cu alloy layer beyond the opening by chemical mechanical polishing, leaving an exposed surface of the Cu or Cu alloy oxidized;

forming the layer of copper silicide on the exposed upper surface of the Cu or Cu alloy layer, wherein treatment with the plasma removes or substantially reduces the oxidized surfaces; and forming a diffusion barrier layer on the layer of copper silicide.

12. The method according to claim 11, comprising forming the diffusion barrier layer by depositing a layer comprising silicon nitride.

13. The method according to claim 11, comprising forming a barrier layer in the opening and depositing the Cu or Cu alloy layer on the barrier layer.

14. The method according to claim 13, comprising:

depositing a seed layer on the barrier layer; and electroplating or electroless plating the Cu or Cu alloy layer on the seed layer.

15. The method according to claim 12, comprising forming the layer of copper silicide on the Cu or Cu alloy layer and depositing the silicon nitride diffusion barrier layer in the same tool.

* * * * *